US010154585B2

(12) United States Patent
Yatsuka et al.

(10) Patent No.: US 10,154,585 B2
(45) Date of Patent: Dec. 11, 2018

(54) PROCESS FOR PRODUCING CONDUCTIVE COATING FILM, AND CONDUCTIVE COATING FILM

(75) Inventors: Takeshi Yatsuka, Otake (JP); Chiho Ito, Otake (JP); Yasuo Kakihara, Otake (JP); Hirotoshi Kizumoto, Ohtsu (JP); Koji Shoki, Ohtsu (JP)

(73) Assignees: TODA KOGYO CORPORATION, Hiroshima (JP); TOYOBO CO., LTD., Osaka (JP)

( * ) Notice: Subject to any disclaimer, the term of this patent is extended or adjusted under 35 U.S.C. 154(b) by 0 days.

(21) Appl. No.: 14/117,976

(22) PCT Filed: May 17, 2012

(86) PCT No.: PCT/JP2012/062649
§ 371 (c)(1),
(2), (4) Date: Feb. 7, 2014

(87) PCT Pub. No.: WO2012/157701
PCT Pub. Date: Nov. 22, 2012

(65) Prior Publication Data
US 2014/0141238 A1    May 22, 2014

(30) Foreign Application Priority Data
May 18, 2011   (JP) .................. 2011-111871

(51) Int. Cl.
*H05K 1/00* (2006.01)
*H05K 1/09* (2006.01)
*C09D 5/24* (2006.01)
*C08J 7/04* (2006.01)
*H05K 3/22* (2006.01)
*C09D 7/61* (2018.01)
*C08K 3/08* (2006.01)

(52) U.S. Cl.
CPC ............ *H05K 1/095* (2013.01); *C08J 7/045* (2013.01); *C09D 5/24* (2013.01); *C09D 7/61* (2018.01); *H05K 3/227* (2013.01); *C08J 2379/08* (2013.01); *C08K 3/08* (2013.01); *Y10T 428/266* (2015.01)

(58) Field of Classification Search
None
See application file for complete search history.

(56) References Cited

U.S. PATENT DOCUMENTS

| | | | |
|---|---|---|---|
| 4,971,863 A * | 11/1990 | Hart | C08J 7/047 427/402 |
| 5,025,086 A * | 6/1991 | Blount, Jr. | C07C 69/757 428/480 |
| 5,326,643 A * | 7/1994 | Adamopoulos et al. | 428/472.2 |
| 2001/0021451 A1* | 9/2001 | Tokunaga et al. | 428/343 |
| 2006/0163744 A1* | 7/2006 | Vanheusden et al. | 257/773 |
| 2011/0030999 A1* | 2/2011 | Lee et al. | 174/255 |

FOREIGN PATENT DOCUMENTS

| | | |
|---|---|---|
| JP | 07-242833 | 9/1995 |
| JP | 7-242833 | 9/1995 |
| JP | 08-073812 | 3/1996 |
| JP | 8-073812 | 3/1996 |
| JP | 2004-171658 | 6/2004 |
| JP | 2006-062135 | 3/2006 |
| JP | 2006062135 A * | 3/2006 |
| JP | 2010-199285 | 9/2010 |
| JP | 2011-082145 | 4/2011 |
| JP | 2011082145 A * | 4/2011 |
| JP | 2011-093297 | 5/2011 |

OTHER PUBLICATIONS

International Search Report for PCT/JP2012/062649, dated Aug. 14, 2012.
International Preliminary Report on Patentability in PCT/JP2012/062649 dated Nov. 28, 2013.

\* cited by examiner

*Primary Examiner* — Brian K Talbot
(74) *Attorney, Agent, or Firm* — Nixon & Vanderhye P.C.

(57) ABSTRACT

An object of the present invention is to provide a conductive coating film formed on a polyimide-based insulating substrate by using a metal powder paste which can exhibit a good conductivity and good adhesion to the insulating substrate. By forming a resin cured layer having a solvent-soluble content of not more than 20% by weight and a thickness of not more than 5 μm on a polyimide-based insulating substrate; forming a metal powder-containing coating layer on the resin cured layer by using a metal powder paste; and then subjecting the resulting coating layer to heat treatment with superheated steam, it is possible to obtain a conductive coating film which can exhibit a good conductivity and good adhesion to the insulating substrate.

8 Claims, No Drawings

PROCESS FOR PRODUCING CONDUCTIVE COATING FILM, AND CONDUCTIVE COATING FILM

This application is the U.S. national phase of International Application No. PCT/JP2012/062649, filed 17 May 2012, which designated the U.S. and claims priority to Japan Application No. 2011-111871, filed 18 May 2011, the entire contents of each of which are hereby incorporated by reference.

TECHNICAL FIELD

The present invention relates to a process for producing a conductive coating film that is excellent in adhesion to a polyimide-based insulating substrate and electric conductivity, and a conductive coating film produced by the process.

BACKGROUND ART

In recent years, there is rapid progress of conductive circuits with a high density. The conventional subtractive process used for forming the conductive circuits in which a copper foil laminated on an insulating substrate is etched for patterning thereof requires a prolonged time and is complicated, resulting in production of a large amount of wastes. In consequence, instead of the subtractive process, a printing process or a coating process using a conductive paste comprising conductive particles to form the conductive circuits has been noticed. For example, in a screen printing method generally used for circuit printing, flake-like metal particles having a particle diameter of not less than several micrometers or the like are used as the conductive particles to form a circuit having a thickness of not less than 10 μm and thereby ensure a conductivity thereof. In order to form a circuit having a higher density, still finer metal particles have been developed.

Various kinds of metals may be used as the conductive particles. In view of conductivity and stability with time, among these metals, silver is generally used as the conductive particles. However, silver is not only expensive and a source with a less output, but also has the problem concerning ion migration generated between circuits under high-temperature and high-humidity conditions. Copper has been used as alternative conductive particles in place of silver. However, since copper particles tend to readily form an oxide layer on a surface thereof, there tends to arise such a problem that the copper particles are deteriorated in conductivity owing to the oxide layer. In addition, as the particle size of the copper particles is reduced, the adverse influence of the oxide layer on a conductivity of the particles tends to become more remarkable. In consequence, in order to reduce the oxide layer on the copper particles, it is required that the copper particles are subjected to reducing treatment at a temperature exceeding 300° C. in a reducing atmosphere such as hydrogen or to sintering treatment at a much higher temperature, whereby the conductivity of the copper particles becomes closer to that of a bulk copper. However, even the thus treated copper particles can be used only in limited applications in which an insulating substrate used therewith must be formed of a high heat-resistant material such as ceramic materials and glass.

A conductive paste using a polymer compound as an organic binder is known as a polymer-type conductive paste. The polymer-type conductive paste using the organic binder can ensure fixing of conductive particles and adhesion to a substrate. However, since the organic binder inhibits contact between the conductive particles, the polymer-type conductive paste tends to be deteriorated in conductivity. In general, as the proportion of the conductive particles to the organic binder in the conductive paste is increased, the adhesion of the conductive paste to the substrate is deteriorated, but the conductivity of the conductive paste is enhanced. When the proportion of the conductive particles is further increased, the conductivity of the conductive paste reaches a maximum value and then is decreased owing to increase in voids in the obtained coating film.

The conductive paste using a polymer compound as the organic binder can exhibit a conductivity owing to contact between the conductive particles. The conductivity of even the polymer-type conductive paste using silver particles tends to be reduced to about $1/10$ to about $1/1000$ time a conductivity of a bulk silver. It is general that the polymer-type conductive paste using copper particles is further deteriorated in conductivity as compared to the silver paste.

In addition, copper tends to rapidly undergo surface oxidation at an elevated temperature. Since the oxidation of copper is accompanied with change in volume of the copper, the copper tends to suffer from occurrence of stress therein, so that adhesion of the copper layer to the substrate generally tends to be deteriorated. The deterioration in adhesion of the copper layer to the substrate tends to become more remarkable as the degree of sintering of the copper particles is increased. Also, the internal stress caused at a boundary between a copper foil such as a copper plating layer and the substrate is larger than that caused at a boundary between a copper powder-containing layer and the substrate. Therefore, in the case where the copper plating layer is formed on the substrate, the deterioration in adhesion of the copper plating layer to the substrate at an elevated temperature tends to become more remarkable than that of the copper powder-containing layer.

In the conventional arts, there has also been proposed the method of enhancing a conductivity of a coating film obtained from a polymer-type conductive paste. For example, in Patent Document 1, it is described that metal fine particles having a particle diameter of not more than 100 nm can be sintered at a temperature far lower than a melting point of a bulk metal to obtain a metal thin film having an excellent conductivity. Also, in Patent Document 2, it is described that a coating film obtained from a metal powder paste is treated with superheated steam. In Patent Document 3, it is described that after treated with superheated steam, a plating layer is formed to obtain a metal thin film.

However, a coating film obtained from a conductive paste comprising metal particles such as copper particles and silver particles is still insufficient in conductivity, and therefore it is required to further improve properties thereof. Further, as the temperature used for treating the coating film with superheated steam is increased, the resulting coating film can exhibit a good conductivity, but there tends to arise such a problem that adhesion of the coating film to an insulating substrate is deteriorated.

CITATION LIST

Patent Literature

Patent Document 1: Japanese Patent Application Laid-Open (KOKAI) No. 03-034211
Patent Document 2: International Patent Application Laid-Open No. WO 2010/095672
Patent Document 3: Japanese Patent Application Laid-Open (KOKAI) No. 2011-60653

SUMMARY OF THE INVENTION

Problem to be Solved by the Invention

An object of the present invention is to provide a process for producing a conductive coating film having a good conductivity from a paste comprising metal particles (powder) on a polyimide-based insulating substrate which can maintain good adhesion to the insulating substrate even when subjected to superheated steam treatment. In the preferred embodiment of the present invention, it is possible to obtain a conductive coating film having an excellent conductivity even when it is in the form of a coating film formed from a metal powder paste comprising metal particles and a large amount of a resin binder.

In addition, the present invention provides a process for producing a plating layer-containing conductive coating layer in which the conductive coating film formed by plating is enhanced in adhesion strength to the insulting substrate even when held in high-temperature conditions.

Means for Solving the Problem

As a result of the present inventors' earnest study for solving the above conventional problems, the present invention has been attained. The present invention includes the following aspects.

(1) A process for producing a conductive coating film, comprising the steps of:

forming a resin cured layer having a solvent-soluble content of not more than 20% by weight and a thickness of not more than 5 μm on a polyimide-based insulating substrate;

forming a metal powder-containing coating film on the resin cured layer by using a metal powder paste; and then subjecting the resulting coating film to heat treatment with superheated steam.

(2) The process for producing a conductive coating film as described in the above aspect (1), wherein the metal powder paste comprises metal particles, an organic binder, and a solvent in which the metal particles and the organic binder are dispersed.

(3) The process for producing a conductive coating film as described in the above aspect (1) or (2), wherein the metal powder paste comprises at least one compound selected from the group consisting of a phenol resin, an amino resin, an isocyanate compound, an epoxy compound, an oxetane compound and an acid anhydride.

(4) The process for producing a conductive coating film as described in any one of the above aspects (1) to (3), wherein the metal powder paste comprises at least one compound selected from the group consisting of an epoxy compound, an oxetane compound and an acid anhydride which have a molecular weight of less than 500.

(5) The process for producing a conductive coating film as described in any one of the above aspects (1) to (4), wherein the metal particles is selected from the group consisting of copper, nickel, cobalt, silver, platinum, gold, molybdenum and titanium.

(6) The process for producing a conductive coating film as described in any one of the above aspects (1) to (5), wherein the resin cured layer comprises any of a reaction product of a resin and a curing agent, a self-cured product of a resin comprising a reactive functional group therein and a photo-crosslinked product, and the resin is selected from the group consisting of a polyester, a polyurethane, a polycarbonate, a polyether, a polyamide, a polyamide imide, a polyimide and an acrylic resin.

(7) The process for producing a conductive coating film as described in any one of the above aspects (1) to (6), wherein the superheated steam has a temperature of 150 to 450° C.

(8) A conductive coating film produced by the process as described in any one of the above aspects (1) to (7).

(9) A process for producing a plating layer-containing conductive coating film, comprising the step of forming a plating layer on the conductive coating film produced by the process as described in any one of the above aspects (1) to (7).

(10) A plating layer-containing conductive coating film produced by the process as described in the above aspect (9).

Effect of the Invention

The process for producing a conductive coating film according to the present invention comprises the steps of forming a resin cured layer on a polyimide-based insulating substrate; forming a metal powder-containing coating layer on the resin cured layer by using a metal powder paste; and then subjecting the resulting coating layer to heat treatment with superheated steam. By subjecting the coating layer to superheated steam treatment, it is possible to not only efficiently remove an organic binder component that is present between the metal particles, but also reduce an oxide on the surface of the respective metal particles. In addition, by forming the specific resin cured layer, it is possible to suppress deterioration in adhesion property of the resulting coating layer to the substrate owing to the superheated steam treatment. As a result, it is possible to obtain the conductive coating film that is excellent in adhesion to the substrate and conductivity.

Further, even when the conductive coating film is stored under high-temperature conditions for a long period of time, it is possible to prevent deterioration in adhesion strength thereof owing to a stress caused at a boundary of the conductive coating film by oxidation of the metal particles or change in crystalline condition of the metal particles. Furthermore, when forming a metal plating layer on the superheated steam-treated conductive coating film, it is possible to prevent deterioration in adhesion strength thereof even upon being held at a high temperature.

PREFERRED EMBODIMENTS FOR CARRYING OUT THE INVENTION

The metal powder paste used in the present invention is prepared by dispersing metal particles and an organic binder as main components in a solvent. The metal particles may be formed into fused particles or unfused particles when subjected to heat treatment. Examples of the kind of metal constituting the metal particles include copper, nickel, cobalt, silver, platinum, gold, molybdenum, titanium or the like. Among these metals, especially preferred are copper and silver.

The copper particles may be in the form of metal particles comprising copper as a main component or a copper alloy comprising copper in an amount of not less than 80% by weight in which the surface of the respective copper particles may be coated with silver. In such a case, the copper particles may be completely coated with silver, or may be partially coated with silver such that a part of the copper is exposed to outside. In addition, the copper particles may be provided on the surface thereof with an oxide layer unless the resulting particles are deteriorated in conductivity. The shape of the copper particles may be any of a generally spherical shape, a dendritic shape, a flake-like shape or the like. As the copper particles or copper alloy particles, there may be used copper particles obtained by wet reaction process, electrolytic copper particles, atomized copper particles, vapor phase-reduced copper particles or the like.

The silver particles may be in the form of metal particles comprising silver as a main component. The shape of the silver particles may be a spherical shape, a flake-like shape, a dendritic shape or the like.

The metal particles used in the present invention preferably have an average particle diameter of 0.01 to 20 µm. When the average particle diameter of the metal particles is more than 20 µm, it may be difficult to form a fine wiring pattern on the insulating substrate. On the other hand, when the average particle diameter of the metal particles is less than 0.01 µm, there tends to occur distortion of the resulting coating film owing to fusion between the fine particles upon the heat treatment, so that the coating film tends to be deteriorated in adhesion to the insulating substrate. The average particle diameter of the metal particles is more preferably in the range of 0.02 to 15 µm, still more preferably 0.04 to 4 µm and further still more preferably 0.05 to 2 µm. The average particle diameter of the metal particles may be determined from an average value of particle diameters of the 100 metal particles as measured by any of a transmission electron microscope, a field emission-type transmission electron microscope and a field emission-type scanning electron microscope. In the present invention, there may be used the metal particles that are different in particle diameter from each other, as long as the average particle diameter of the metal particles lies within the range of 0.01 to 20 µm.

The solvent used in the metal powder paste used in the present invention may be selected from those solvents capable of dissolving the organic binder therein, and may be either an organic compound or water. The solvent serves not only for dispersing the metal particles in the metal powder paste, but also for controlling a viscosity of the resulting dispersion. Examples of the organic solvent include alcohols, ethers, ketones, esters, aromatic hydrocarbons and amides.

Examples of the organic binder used in the metal powder paste used in the present invention include resins such as polyesters, polyurethanes, polycarbonates, polyethers, polyamides, polyamide imides, polyimides and acrylic resins. Among these resins, preferred are those having an ester bond, a urethane bond, an amide bond, an ether bond, an imide bond or the like from the viewpoint of a good stability of the metal particles.

The metal powder paste used in the present invention usually comprises the metal particles, the solvent and the organic binder. The contents of the solvent and the organic binder in the metal powder paste are 10 to 40 parts by weight and 3 to 30 parts by weight, respectively, based on 100 parts by weight of the metal particles. When the content of the binder resin in the metal powder paste is less than 3 parts by weight based on 100 parts by weight of the metal particles, the resulting coating film tends to be remarkably deteriorated in adhesion to the insulating substrate. On the other hand, when the content of the binder resin in the metal powder paste is more than 30 parts by weight based on 100 parts by weight of the metal particles, the metal particles tend to have a poor opportunity of being contacted with each other, so that it is not possible to ensure a good conductivity of the resulting coating film.

The metal powder paste used in the present invention may further comprise a curing agent and additives, if required. Examples of the curing agent and additives used in the present invention include a phenol resin, an amino resin, an isocyanate compound, an epoxy compound, an oxetane compound and an acid anhydride. The curing agent and additives may be used in an amount of 1 to 50% by weight based on the organic binder.

The curing agent and additives are preferably those having a reactivity with a functional group contained in the resin cured layer provided on the polyimide-based insulating substrate. In the case where the curing agent and additives have a molecular weight of not more than 500, there tends to occur a less adverse influence on effects of the superheated steam treatment, although the reason therefor is not clearly determined. As the compound to be compounded in the metal powder paste, especially preferred is at least one compound selected from the group consisting of an epoxy compound, an oxetane compound and an acid anhydride which have a molecular weight of less than 500. By compounding the above compound in the metal powder paste, the resulting copper film can be prevented from being deteriorated in adhesion strength to the substrate under high-temperature conditions. Specific examples of the preferred epoxy compound to be compounded in the metal powder paste include bisphenol A-type liquid resins such as "827" and "828" both produced by Mitsubishi Chemical Corporation, bisphenol F-type liquid resins such as "807" and "808" both produced by Mitsubishi Chemical Corporation, and amine-containing epoxy compounds such as "604" and "630" both produced by Mitsubishi Chemical Corporation, and alicyclic epoxy compounds "CEL2021P" and "CEL2000" both produced by Daicel Corp. Specific examples of the preferred oxetane compound include "OXT-101", "OXT-212", "OXT-121" and "OXT-221" all produced by Toagosei Co., Ltd. Specific examples of the preferred acid anhydride include hexahydrophthalic anhydride, methyltetrahydrophthalic anhydride, methylhexahydrophthalic anhydride, methylnadic anhydride, and methylcyclohexenetetracarboxylic dianhydride.

The metal powder paste used in the present invention may also comprise as the organic binder, a polymer comprising a functional group having an adsorptivity to metals such as a sulfonate group and a carboxylate group and may further comprise a dispersant. Examples of the dispersant include higher fatty acids such as stearic acid, oleic acid and myristic acid, fatty acid amides, fatty acid metal salts, phosphoric acid esters and sulfonic acid esters. The dispersant may be used in an amount of 0.1 to 10% by weight based on the organic binder.

Next, the process for producing the metal powder paste is described.

The metal powder paste may be produced by an ordinary method in which the metal particles are dispersed in a liquid. For example, the metal particles and a binder resin solution may be mixed, if required, together with an additional amount of a solvent, and the resulting mixture may be dispersed by an ultrasonic method, a mixer method, a three roll mill method, a ball mill method or the like. These dispersing methods may be used in combination of any two or more thereof. The dispersing treatment may be carried out at room temperature, or may be carried out under heating in order to reduce a viscosity of the dispersion.

Examples of the polyimide-based resin used for the insulating substrate in the present invention include polyimide precursor resins, solvent-soluble polyimide resins and polyamide imide resins. The polyimide-based resin may be produced by an ordinary polymerization method. For example, there may be used the method of reacting a tetracarboxylic acid dianhydride and a diamine in a solution thereof at a low temperature to obtain a solution of a polyimide precursor, the method of reacting a tetracarboxylic acid dianhydride and a diamine in a solution thereof at a high temperature to obtain a solution of a solvent-soluble polyimide, the method of using an isocyanate as a raw material, the method of using an acid chloride as a raw material, or the like.

The sheet or film as the insulating substrate when formed of the polyimide precursor resin may be obtained by an ordinary method in which a solution of the precursor resin is formed into a film by a wet method, and then the resulting film is subjected to imidation reaction at a high temperature. The solvent-soluble polyimide resin or the polyamide imide resin is already imidized in the solution and therefore can be formed into a sheet or a film by the wet method.

The insulating substrate may be previously subjected to surface treatments such as corona discharge treatment, plasma treatment and alkali treatment.

As the raw material for producing the polyimide precursor resin or the solvent-soluble polyimide resin, there may be used the following compounds.

Examples of an acid component of the above resins include monoanhydrides, dianhydrides, esterified products, etc., of pyromellitic acid, benzophenone-3,3',4,4'-tetracarboxylic acid, biphenyl-3,3',4,4'-tetracarboxylic acid, diphenyl sulfone-3,3',4,4'-tetracarboxylic acid, diphenyl ether-3,3',4,4'-tetracarboxylic acid, naphthalene-2,3,6,7-tetracarboxylic acid, naphthalene-1,2,4,5-tetracarboxylic acid, 1,4,5,8-tetracarboxylic acid, hydrogenated pyromellitic acid and hydrogenated biphenyl-3,3',4,4'-tetracarboxylic acid. These acid components may be used alone or in the form of a mixture of any two or more thereof.

Examples of an amine component of the above resins include p-phenylenediamine, m-phenylenediamine, 3,4'-diaminodiphenyl ether, 4,4'-diaminodiphenyl ether, 4,4'-diaminodiphenyl sulfone, 3,3'-diaminodiphenyl sulfone, 3,4'-diaminobiphenyl, 3,3-diaminobiphenyl, 3,3'-diaminobenzanilide, 4,4'-diaminobenzanilide, 4,4'-diaminobenzophenone, 3,3'-diaminobenzophenone, 3,4'-diaminobenzophenone, 2,6-tolylenediamine, 2,4-tolylenediamine, 4,4'-diaminodiphenyl sulfide, 3,3'-diaminodiphenyl sulfide, 4,4'-diaminodiphenyl propane, 3,3'-diaminodiphenyl propane, 4,4'-diaminodiphenyl hexafluoropropane, 3,3'-diaminodiphenyl hexafluoropropane, 4,4'-diaminodiphenyl methane, 3,3'-diaminodiphenyl methane, 4,4'-diaminodiphenyl hexafluoroisopropylidene, p-xylenediamine, m-xylenediamine, 1,4-naphthalenediamine, 1,5-naphthalenediamine, 2,6-naphthalenediamine, 2,7-naphthalenediamine, o-tolidine, 2,2'-bis(4-aminophenyl)propane, 2,2'-bis(4-aminophenyl)hexafluoropropane, 1,3-bis(3-aminophenoxy)benzene, 1,3-bis(4-aminophenoxy)benzene, 1,4-bis(4-aminophenoxy)benzene, 2,2-bis[4-(4-aminophenoxy)phenyl]propane, bis[4-(4-aminophenoxy)phenyl]sulfone, bis[4-(3-aminophenoxy)phenyl]propane, bis[4-(3-aminophenoxy)phenyl]sulfone, bis[4-(3-aminophenoxy)phenyl]hexafluoropropane, 4,4'-bis(4-aminophenoxy)biphenyl, 4,4'-bis(3-aminophenoxy)biphenyl, 2,2-bis[4-(4-aminophenoxy)phenyl]hexafluoropropane, cyclohexyl-1,4-diamine, isophoronediamine, hydrogenated 4,4'-diaminodiphenylmethane, and corresponding diisocyanate compounds thereof. These amine components may be used alone or in the form of a mixture of any two or more thereof.

In addition, resins separately produced by polymerizing these acid components and amine components in combination with each other may be mixed in the above polyimide precursor resin or the solvent-soluble polymer resin.

Examples of an acid component as a raw material of the polyamide imide resins include tricarboxylic anhydrides such as trimellitic anhydride, diphenyl ether-3,3',4'-tricarboxylic anhydride, diphenyl sulfone-3,3',4'-tricarboxylic anhydride, benzophenone-3,3',4'-tricarboxylic anhydride, naphthalene-1,2,4-tricarboxylic anhydride, and hydrogenated trimellitic anhydride. These acid components may be used alone or in the form of a mixture of any two or more thereof. The tricarboxylic anhydrides may be used in combination with tetracarboxylic acids or anhydrides thereof, dicarboxylic acids, etc., which are mentioned above with respect to the polyimide resins.

Examples of an amine component as a raw material of the polyamide imide resins include the diamines and diisocyanates which are mentioned above with respect to the polyimide resins. These amine components may be used alone or in the form of a mixture of any two or more thereof.

In addition, resins separately produced by polymerizing these acid components and amine components in combination with each other may be mixed in the above polyamide imide resin.

The conductive coating film according to the present invention is provided on the resin cured layer formed on the polyimide-based insulating substrate, and therefore is excellent in not only conductivity but also adhesion property after subjected to the superheated steam treatment. The "excellent conductivity" as used in the present invention means that the conductive coating film has a specific resistance of not more than 50 µΩ·cm. Also, the "excellent adhesion property" as used in the present invention means that when subjecting the conductive coating film to a rapid peel test in which a cellophane tape is laminated onto the coating film and rapidly peeled off, there occurs no peeling between the insulating substrate and the conductive coating film, or a proportion of the peeled portion between the insulating substrate and the conductive coating film, if observed, is not more than 10% based on a whole laminated portion therebetween.

Examples of a material constituting the resin cured layer include a reaction product of the resin and the curing agent, a self-cured product of a resin comprising a reactive functional group therein, a photo-crosslinked product, etc.

Examples of the resin used for the resin cured layer include polyesters, polyurethanes, polycarbonates, polyethers, polyamides, polyamide imides, polyimides and acrylic resins. Among these resins, preferred are those having an ester bond, an imide bond, an amide bond or the like from the viewpoints of a good heat resistance of the resin cured layer and a good adhesion property to the insulating substrate.

Specific examples of combinations of the materials for obtaining the resin cured layer are as follows. That is, there may be used combinations of a high acid value polyester and an epoxy compound; a polyester having a bisphenol A or resorcinol skeleton and a heat-curing phenol resin (resole resin); a high hydroxyl group content polyurethane and a polyisocyanate compound; and a polyester, an epoxy compound and a tetracarboxylic dianhydride. Also, the resin cured layer may be formed of a self-cured product of a resin having a reactive functional group therein. Examples of the resin having a reactive functional group therein include an oxetane-containing resin having an oxetane group and a carboxyl group, a resin having an alkoxysilane group therein, and an oxazoline-containing resin. Further, the resin cured layer may be readily produced from compounds that can be cured by irradiation with a visible light or a UV light such as photosensitive polyimides obtained by introducing a (meth)acryloyl group into a polyamic acid as a polyimide precursor through an ester bond, photosensitive polyimides obtained by adding an amine compound having a (meth) acryloyl group to a polyamic acid to form an ionic bond between an amino group and a carboxyl group therein, or the like.

The resin cured layer may be formed by applying an organic solvent solution or a water dispersion of the above resin onto the polyimide-based insulating substrate, and drying the resulting layer, if required, followed by subjecting the layer to heat treatment or irradiation with light.

The solvent-soluble content in the resin cured layer is not more than 20% by weight, in particular, preferably not more than 15% by weight. When the solvent-soluble content in the resin cured layer is more than 20% by weight, the resulting layer tends to be remarkably deteriorated in adhesion property owing to the superheated steam treatment. In addition, if the metal powder paste is applied on the coating film having a solvent-soluble content of more than 20% by weight, the resin cured layer is invaded by the solvent in the metal powder paste, and the obtained conductive coating film tends to be deteriorated in adhesion property and conductivity. The lower limit of the solvent-soluble content in the resin cured layer is preferably 0.1% by weight.

The thickness of the resin cured layer formed according to the present invention is not more than 5 μm, in particular, preferably not more than 2 μm. When the thickness of the resin cured layer is more than 5 μm, the resin cured layer tends to be deteriorated in adhesion property owing to distortion generated upon curing of the resin cured layer, etc., so that the adhesion property of the resin cured layer tends to be more remarkably deteriorated when subjected to the superheated steam treatment. Meanwhile, the lower limit of the thickness of the resin cured layer is usually 0.01 μm from the standpoint of attaining the effect of improving an adhesion property thereof when subjected to the superheated steam treatment.

The method of applying the metal powder paste onto the resin cured layer formed on the insulating substrate to form the conductive coating film is explained below. Meanwhile, the conductive coating film may be provided over a whole surface of the insulating substrate, or may be in the form of a patterned film such as a conductive circuit. Further, the conductive coating film may be formed on one or both surfaces of the insulating substrate.

In order to form the coating film comprising the metal particles on the resin cured layer formed on the insulating substrate by using the paste contains the metal powder, there may be used ordinary methods used for applying or printing the metal powder paste on a film or a sheet. For example, there may be used a screen printing method, a dip coating method, a spray coating method, a spin coating method, a roll coating method, a die coating method, an ink-jetting method, a letterpress printing method, an intaglio printing method, etc. By evaporating the solvent from the coating film formed by applying or printing the metal powder paste by heating, under reduced pressure or the like, it is possible to form the metal powder-containing coating film. In general, in the case where the metal particles are copper particles, the metal powder-containing coating film obtained at the stage of evaporating the solvent has a specific resistance of not less than 1 Ω·cm, and therefore does not exhibit yet a sufficient conductivity required for conductive circuits.

The drying procedure may be completed after the resin cured layer is formed on a primary dried product of a polyimide precursor solution for forming the polyamide-based resin used as the insulating substrate or on a primary dried product of the polyimide solution or the polyamide imide solution for forming the polyamide-based resin used as the insulating substrate. Alternatively, the drying procedure may be completed after the metal powder paste is further applied onto the thus formed resin cured layer. While allowing 10 to 30% by weight of the solvent to remain on the primary dried product of the polyimide-based precursor solution or the polyimide-based solution, the resin cured layer and the metal powder paste are successively applied thereon and then completely dried, so that adhesion between the polyimide-based resin layer and the resin cured layer and between the resin cured layer and the metal powder-containing coating film can be strengthened.

As the solvent for the polyimide-based precursor solution or the polyimide-based solution, there may be generally used an amide-based solvent. Since the amide-based solvent has a poor drying property, it is required that the drying temperature thereof is increased to not lower than 150° C. In such a case, when using copper particles as the metal particles, the copper particles tend to be readily oxidized. Therefore, it is preferred that the drying is conducted in an inert gas such as nitrogen or in an oxygen-free state such as superheated steam.

As a heat source for the heat treatment in the production process of the present invention, there may be used superheated steam having larger heat capacity and specific heat than those of air. The superheated steam is such a steam as obtained by further heating saturated steam to a still higher temperature.

It is preferred that the superheated steam treatment is conducted after removing the solvent from the metal-containing coating film under heating or in vacuo. When the superheated steam treatment is directly conducted without the primary drying step, the solvent in the coating film tends to suffer from bumping in some cases.

After completion of the primary drying step, the drying and heat treatment with superheated steam is carried out. The superheated steam treatment may be conducted in combination with hot-air drying or infrared or far-infrared drying. The temperature of the superheated steam used in the treatment is in the range of 150 to 450° C. and preferably 200 to 380° C. When the temperature of the superheated steam is lower than 150° C., it may be difficult to attain sufficient effects by the treatment. When the temperature of the superheated steam is higher than 450° C., the resin tends to be deteriorated. An optimum temperature of the superheated steam used in the treatment may vary depending upon the aimed range of a conductivity of the conductive coating film, or the metal particles or organic binder resin used therein.

Although the superheated steam is held in an almost completely oxygen-free state, in the case where air is mixed therein when exposed to a high temperature such as not lower than 150° C. upon the drying heat treatment, it is required that the oxygen concentration of the superheated steam is reduced. In particular, in the case where the metal particles are copper particles, since the copper particles are readily oxidized at a high temperature, the resulting conductive coating film tends to be deteriorated in conductivity. When using the copper particles, the oxygen concentration of the superheated steam is reduced to not more than 1% and preferably not more than 0.1%.

EXAMPLES

The present invention is described in more detail by the following Examples. However, these Examples are only illustrative and therefore not intended to limit the invention thereto. Various properties described in Examples and Comparative Examples were measured by the following methods.

Specific Resistance:

The specific resistance was measured using a low resistivity meter "LORESTA GP" and a probe "ASP" manufactured by Mitsubishi Chemical Corporation.

Solvent-Soluble Content:

The solvent-soluble content of the resin cured layer was determined as follows. The resulting polyimide-based film with the resin cured layer was cut into a predetermined area, and the cut film was immersed in the same solvent as used for dissolving the resin for forming the resin cured layer at 25° C. for 1 hr, and then dried to calculate the solvent-soluble content from the following formula.

Solvent-soluble content=(W1-W2)/(W1-W0)×100(%) wherein W0 is a weight of a polyimide film obtained by completely rubbing off the resin cured layer from the polyimide film with the resin cured layer; W1 is a weight of the polyimide film with the resin cured layer before immersed in the solvent; and W2 is a weight of the polyimide film with the resin cured layer after immersed in the solvent.

Adhesion Property:

A cellophane tape was laminated onto the metal powder-containing coating film and rapidly peeled off therefrom. The evaluation was conducted based on the following ratings.

A—No peeling occurred between the insulating substrate and the conductive coating film.

B—Peeling was recognized, but was less than 10% of a laminated area of the cellophane tape.

C—Peeling was recognized, and was not less than 10% of a laminated area of the cellophane tape.

Peel Strength:

The metal powder-containing coating film was treated with superheated steam, and then subjected to plating to form a plating layer thereon. The adhesion strength of the coating film was measured by the method of peeling the plating layer from the substrate. The peel test was conducted in such a manner that one edge of the plating layer on the test specimen was torn-off, and then the plating layer was pulled and peeled at a pulling rate of 100 mm/min from the one edge in the direction of folding the plating layer at an angle of 180°.

<Copper Particles Used>

Copper Particles 1:

In water, a pH value of an aqueous copper (II) sulfate solution was adjusted to 12.5 using sodium hydroxide, and the copper (II) sulfate was reduced into copper suboxide using anhydrous glucose and thereafter further reduced into copper particles using hydrated hydrazine. The resulting particles were observed using a transmission electron microscope. As a result, it was confirmed that the particles were spherical particles having an average particle diameter of 0.07 μm.

Copper Particles 2:

Copper suboxide suspended in water comprising tartaric acid was reduced into copper particles using hydrated hydrazine. The resulting particles were observed using a transmission electron microscope. As a result, it was confirmed that the particles were spherical particles having an average particle diameter of 1.5 μm.

<Silver Particles Used>

Silver Particles 1:

An aqueous sodium hydroxide solution was added to an aqueous silver nitrate solution to prepare a silver oxide slurry. Thereafter, sodium myristate was added as an organic protective agent to the slurry, and the silver oxide was reduced into silver particles using formalin. The resulting particles were observed using a transmission electron microscope. As a result, it was confirmed that the particles were spherical particles having an average particle diameter of 0.12 μm.

Silver Particles 2:

Silver particles obtained by wet reaction process "SPN10J" produced by Mitsui Mining & Smelting Co., Ltd., in the form of spherical particles having an average particle diameter of 2 μm.

<Polyimide Film with Resin Cured Layer>

AC-1, AC-2:

A polyester (Pes-1) used was produced by the following polymerization method. An autoclave for polymerization of polyesters was charged with 49.6 parts of ethylene glycol, 125 parts of neopentyl glycol, 97 parts of dimethyl terephthalate, 97 parts of dimethyl isophthalate and 0.068 part of tetrabutoxytitanium, and the contents of the autoclave were subjected to transesterification reaction at a temperature of 150 to 230° C. for 60 min. While further heating the contents of the autoclave to 260° C. over 30 min, the pressure of the reaction system was gradually reduced to initiate deglycolation of the transesterification reaction product. After the pressure within the autoclave finally reached 0.1 mmHg at 260° C., the high-temperature and high-vacuum conditions were held for 30 min. Successively, nitrogen was introduced into the autoclave to return the pressure within the autoclave to normal pressures, and 9.6 parts of trimellitic anhydride were charged into the reaction system at 230° C., thereby obtaining an acid-terminated polyester (Pes-1). The composition was analyzed by NMR, the valence of a functional group in the polyester was measured by acid-base titration, and the molecular weight of the polyester was measured by GPC. The results are shown in Table 1.

A solution of Pes-1 in methyl ethyl ketone/toluene (weight ratio: 1/1) was mixed with a phenol novolak type epoxy resin "152" produced by Mitsubishi Chemical Corporation, and triphenyl phosphine (TPP) at the compounding ratio shown in Table 2. The resulting composition was applied onto a polyimide film "APICAL NPI (thickness: 25 μm)" produced by KANEKA Corp., such that the thickness of the coating film obtained after dried was 0.5 μm, and then subjected to drying and heat treatment at 180° C. for 5 min. The resulting polyimide film with the resin cured layer was cut into a predetermined area, and the cut film was immersed in methyl ethyl ketone/toluene (weight ratio: 1/1) at 25° C. for 1 hr, and then dried to determine a solvent-soluble content thereof. The evaluation results are shown in Table 2.

AC-3, AC-4:

A polyester (Pes-2) used was produced by the following polymerization method. An aliphatic polyester diol ("KURAPOL P-2010" produced by Kuraray Co., Ltd.; poly (3-methyl-1,5-pentane adipate); molecular weight: 2000), benzophenonetetracarboxylic dianhydride (BTDA) and triethylamine as a reaction catalyst were reacted in methyl ethyl ketone/toluene (weight ratio: 1/1) as a solvent at 60° C., thereby obtaining a polyester (Pes-2) shown in Table 1. In the same manner as used for production of AC-1, a phenol novolak type epoxy resin "152" produced by Mitsubishi Chemical Corporation, and triphenyl phosphine (TPP) were added to Pes-2. The resulting composition was applied onto a polyimide film such that the thickness of the coating film obtained after dried was 1 μm, and then subjected to drying and heat treatment at 180° C. for 5 min. The evaluation results are shown in Table 2.

AC-5, AC-6:

In the same manner as used for production of Pes-1, the melt polymerization was conducted under high-temperature and high-vacuum conditions, thereby obtaining a polyester (Pes-3) shown in Table 1. A composition comprising a solution of Pes-3 in methyl ethyl ketone/toluene (weight ratio: 1/1), a heat-curing phenol resin "RESITOP PL-2407" produced by Gunei Chemical Industry Co., Ltd., and p-toluenesulfonic acid (p-TS) as a reaction catalyst was applied onto a polyimide film, and then subjected to drying and heat treatment at 200° C. for 2 min. Pes-3 comprised a diol (BA-2EO) obtained by adding one ethyleneoxide molecule to respective hydroxyl groups of bisphenol A as a diol component of the polyester. The evaluation results are shown in Table 2.

AC-7:

In the same manner as used for production of Pes-1, the melt polymerization was conducted under high-temperature and high-vacuum conditions, thereby obtaining a polyester (Pes-4) shown in Table 1. A composition comprising a solution of Pes-4 in methyl ethyl ketone/toluene (weight ratio: 1/1), a heat-curing phenol resin "RESITOP PL-2407" produced by Gunei Chemical Industry Co., Ltd., and p-toluenesulfonic acid (p-TS) as a reaction catalyst was applied onto a polyimide film, and then subjected to drying and heat treatment at 200° C. for 2 min. Pes-4 comprised a diol (RS-2EO) obtained by adding one ethyleneoxide molecule to respective hydroxyl groups of resorcinol as a diol component of the polyester. The evaluation results are shown in Table 2.

AC-8, AC-9:

In the same manner as used for production of Pes-1, the melt polymerization was conducted under high-temperature and high-vacuum conditions, thereby obtaining a polyester (Pes-5) shown in Table 1. A composition comprising a solution of Pes-5 in methyl ethyl ketone/toluene (weight ratio: 1/1), a phenol novolak type epoxy resin "152" produced by Mitsubishi Chemical Corporation, benzophenonetetracarboxylic dianhydride (BTDA) and triphenyl phosphine (TPP) as a reaction catalyst was applied onto a polyimide film, and then subjected to drying and heat treatment at 220° C. for 5 min. Pes-5 was a hydroxyl-terminated polyester. The evaluation results are shown in Table 2.

AC-10, AC-11:

A polyurethane resin (Pu-1) used was produced by the following polymerization method. An isocyanate-terminated prepolymer obtained from an aliphatic polyester diol ("KURAPOL P-2010" produced by Kuraray Co., Ltd.; poly (3-methyl-1,5-pentane adipate); molecular weight: 2000) and diphenylmethane diisocyanate (MDI) was charged into a mixed solvent of methyl ethyl ketone/toluene (weight ratio: 1/1) comprising N-(β-aminoethyl)ethanolamine (EA), thereby obtaining a hydroxyl group-containing polyurethane/urea (Pu-1) solution. The thus obtained solution was compounded with polyisocyanate "CORONATE HX" produced by Nippon Polyurethane Industry Co., Ltd., and then the resulting composition was applied onto a polyimide film such that the thickness of the coating film obtained after dried was 1 μm, and then subjected to drying and heat treatment at 150° C. for 10 min. The evaluation results are shown in Table 2.

AC-12:

A polyurethane resin (Pu-2) used was produced by the following polymerization method. An isocyanate-terminated prepolymer obtained from an aliphatic polyester diol ("KURAPOL P-2010" produced by Kuraray Co., Ltd.; poly (3-methyl-1,5-pentane adipate); molecular weight: 2000) and diphenylmethane diisocyanate (MDI) was charged into a mixed solvent of methyl ethyl ketone/toluene (weight ratio: 1/1) comprising N-(β-aminoethyl)ethanolamine (EA), thereby obtaining a hydroxyl group-containing polyurethane/urea resin. The thus obtained resin was further compounded with an isocyanate group-containing silane coupling agent "KBE-9007" produced by Shin-Etsu Chemical Co., Ltd., to react the silane coupling agent with a hydroxyl group of the polyurethane/urea resin. The thus obtained ethoxysilane-containing polyurethane/urea (Pu-2) solution was mixed with a very small amount of 1N hydrochloric acid, and then the resulting composition was applied onto a polyimide film such that the thickness of the coating film obtained after dried was 1 μm, and then subjected to drying and heat treatment at 180° C. for 10 min. The evaluation results are shown in Table 2.

AC-13:

A polyurethane resin (Pu-3) used was produced by the following polymerization method. An aliphatic polyester diol ("KURAPOL P-2010" produced by Kuraray Co., Ltd.; poly(3-methyl-1,5-pentane adipate); molecular weight: 2000), diphenylmethane diisocyanate (MDI), 3,3-bis(hydroxymethyl)oxetane (BHO) and dimethylolbutanoic acid (DMBA) were mixed and reacted in methyl ethyl ketone/toluene (weight ratio: 1/1) to obtain a polyurethane resin (Pu-3) solution comprising an oxetane group and a carboxyl group. The resulting composition was applied onto a polyimide film and then subjected to drying and heat treatment in the same manner as used for production of AC-11. The evaluation results are shown in Table 2.

TABLE 1

| | Composition | Ratio |
|---|---|---|
| Pes-1 | Terephthalic acid/isophthalic acid//ethylene glycol/neopentyl glycol//trimellitic acid | 50/50//50/50//5 (molar ratio) |
| Pes-2 | Poly(3-methyl-1,5-pentane adipate)/BTDA | 100/15 (weight ratio) |
| Pes-3 | Terephthalic acid/isophthalic acid//ethylene glycol/neopentyl glycol/BA-2EO | 50/50//20/20/60 (molar ratio) |
| Pes-4 | Terephthalic acid/isophthalic acid//ethylene glycol/neopentyl glycol/RS-2EO | 50/50//20/30/50 (molar ratio) |
| Pes-5 | Isophthalic acid/sebacic acid//2-methyl-1,3-propanediol | 50/50//100 (molar ratio) |
| Pu-1 | Poly(3-methyl-1,5-pentane adipate)/MDI/EA | 100/25/5.5 (weight ratio) |
| Pu-2 | Poly(3-methyl-1,5-pentane adipate)/MDI/EA/3-isocyanato-propyl triethoxysilane | 100/25/5.5/12 (weight ratio) |
| Pu-3 | Poly(3-methyl-1,5-pentane adipate)/BHO/DMBA/MDI | 100/25/5.5/12 (weight ratio) |

| | Molecular weight (—) | Kind of functional group | Functional group Valence (equivalent/ton) |
|---|---|---|---|
| Pes-1 | 7500 | Acid group | 450 |
| Pes-2 | 12000 | Acid group | 810 |
| Pes-3 | 16000 | Acid group | 5 |
| Pes-4 | 28000 | Acid group | 3 |
| Pes-5 | 18000 | Acid group | 3 |

TABLE 1-continued

| | | | |
|---|---|---|---|
| Pu-1 | 9100 | Hydroxyl group | 405 |
| Pu-2 | 11900 | Triethoxysilane group | 330 |
| Pu-3 | 34900 | Oxetane group | 640 |

Note
BTDA: Benzophenonetetracarboxylic dianhydride
BA-2EO: Diol obtained by adding one ethyleneoxide molecule to respective hydroxyl groups of bisphenol A
RS-2EO: Diol obtained by adding one ethyleneoxide molecule to respective hydroxyl groups of resorcinol
MDI: Diphenylmethane diisocyanate
EA: N-(β-aminoethyl)ethanolamine
BHO: 3,3-bis(hydroxymethyl)oxetane
DMBA: Dimethylolbutanoic acid
Poly(3-methyl-1,5-pentane adipate): "KURAPOL P-2010" produced by Kuraray Co., Ltd.
3-Isocyanato-propyl triethoxysilane: Isocyanate group-containing silane coupling agent "KBE-9007" produced by Shin-Etsu Chemical Co., Ltd.

TABLE 2

Polyimide film with resin cured layer

| | AC-1 | AC-2 | AC-3 | AC-4 | AC-5 | AC-6 | AC-7 |
|---|---|---|---|---|---|---|---|
| Resin cured layer (solid weight ratio) | | | | | | | |
| Resin | | | | | | | |
| Pes-1 | 100 | 100 | | | | | |
| Pes-2 | | | 100 | 100 | | | |
| Pes-3 | | | | | 100 | 100 | |
| Pes-4 | | | | | | | 100 |
| Pes-5 | | | | | | | |
| Pu-1 | | | | | | | |
| Pu-2 | | | | | | | |
| Pu-3 | | | | | | | |
| Curing agent | | | | | | | |
| Epoxy resin-1 | 10 | 20 | 20 | 40 | | | |
| NCO-1 | | | | | | | |
| Phenol resin-1 | | | | | 25 | 25 | 25 |
| BTDA | | | | | | | |
| Catalyst | | | | | | | |
| TPP | | 0.1 | 0.2 | 0.2 | 0.2 | | |
| p-TS | | | | | | 0.3 | 0.3 | 0.3 |
| DBTDL | | | | | | | |
| 1N—HCl | | | | | | | |
| Heat treatment conditions | | | | | | | |
| Temperature (° C.) | 180 | 180 | 180 | 180 | 200 | 200 | 200 |
| Time (min) | 5 | 5 | 5 | 5 | 2 | 2 | 2 |
| Measurement results | | | | | | | |
| Thickness (μm) | 0.5 | 0.5 | 1 | 1 | 1 | 4.5 | 0.1 |
| Solvent-soluble content (%) | 12 | 5.1 | 2.5 | 17 | 2.2 | 2.7 | 1.4 |

Polyimide film with resin cured layer

| | AC-8 | AC-9 | AC-10 | AC-11 | AC-12 | AC-13 |
|---|---|---|---|---|---|---|
| Resin cured layer (solid weight ratio) | | | | | | |
| Resin | | | | | | |
| Pes-1 | | | | | | |
| Pes-2 | | | | | | |
| Pes-3 | | | | | | |
| Pes-4 | | | | | | |
| Pes-5 | 100 | 100 | | | | |
| Pu-1 | | | 100 | 100 | | |
| Pu-2 | | | | | 100 | |
| Pu-3 | | | | | | 100 |
| Curing agent | | | | | | |
| Epoxy resin-1 | 20 | 30 | | | | |
| NCO-1 | | | 10 | 30 | | |
| Phenol resin-1 | | | | | | |
| BTDA | 5 | 5 | | | | |
| Catalyst | | | | | | |
| TPP | 0.5 | 0.5 | | | | |
| p-TS | | | | | | |
| DBTDL | | | 0.01 | 0.01 | | |
| 1N—HCl | | | | | 0.01 | |
| Heat treatment conditions | | | | | | |
| Temperature (° C.) | 220 | 220 | 150 | 150 | 180 | 180 |
| Time (min) | 5 | 5 | 10 | 16 | 10 | 5 |
| Measurement results | | | | | | |
| Thickness (μm) | 0.5 | 0.5 | 0.5 | 0.5 | 0.5 | 0.5 |
| Solvent-soluble content (%) | 13 | 18 | 3.6 | 12 | 11 | 4.1 |

Note Epoxy resin-1: Phenol novolak type epoxy resin "152" produced by Mitsubishi Chemical Corporation.
NCO-1: Polyisocyanate compound "CORONATE HX" produced by Nippon Polyurethane Industry Co., Ltd.
Phenol resin-1: Resole-type phenol resin "RESITOP PL-2407" produced by Gunei Chemical Industry Co., Ltd.
BTDA: Benzophenonetetracarboxylic dianhydride
TPP: Triphenyl phosphine
p-TS: p-Toluenesulfonic acid
DBTDL: Dibutyl tin dilaurate
1N—HCl: 1N aqueous hydrochloric acid solution <Polyimide Film with Comparative Resin Cured Layer>
AC-14 to AC-18:

As shown in Table 3, the polyester (Pes-1) used in AC-1 or the polyester (Pes-2) used in AC-3 was compounded with an epoxy resin as a curing agent and triphenyl phosphine (TPP) as a reaction catalyst, and then the resulting composition was applied onto a polyimide film "APICAL NPI (thickness: 25 μm)" produced by KANEKA Corp., and then dried and cured, thereby forming a resin cured layer. The evaluation results are shown in Table 3.

TABLE 3

Polyimide film with resin cured layer

| | AC-14 | AC-15 | AC-16 | AC-17 | AC-18 |
|---|---|---|---|---|---|
| Resin cured layer (solid weight ratio) | | | | | |
| Resin | | | | | |
| Pes-1 | 100 | 100 | 100 | | |
| Pes-2 | | | | 100 | 100 |
| Curing agent | | | | | |
| Epoxy resin-1 | 5 | 5 | 40 | 50 | 20 |
| Catalyst | | | | | |
| TPP | 0.1 | 0.1 | 0.2 | 0.2 | 0.2 |
| Heat treatment conditions | | | | | |
| Temperature (° C.) | 180 | 180 | 180 | 180 | 180 |
| Time (min) | 5 | 20 | 5 | 5 | 5 |
| Measurement results | | | | | |
| Thickness (μm) | 0.5 | 0.5 | 0.5 | 1 | 10 |
| Solvent-soluble content (%) | 32 | 29 | 26 | 35 | 4.1 |

Example 1

The composition with the following formulation was charged into a sand mill, and dispersed at 800 rpm for 2 hr.

As dispersing media, there were used zirconia beads having a radius of 0.2 mm. The obtained copper paste was applied onto the resin cured layer (AC-1) formed on the polyimide film using an applicator such that the thickness of the coating film obtained after dried was 2 μm, and then subjected to hot-air drying at 120° C. for 5 min, thereby obtaining a copper powder-containing coating film.

Composition of Dispersion

| | |
|---|---|
| Copolyester solution (in the form of a 40% by weight solution in toluene/cyclohexanone = 1/1 (weight ratio)) | 2.5 parts |
| Copper particles 1 (average particle diameter: 0.07 μm) | 9 parts |
| γ-Butyrolactone (diluent) | 3.5 parts |
| Methyl ethyl ketone (diluent) | 5 parts |
| Blocked isocyanate (in which copolyester: "VYLON 300" produced by Toyo Boseki Kabushiki Kaisha; blocked isocyanate: "CORONATE 2546" produced by Nippon Polyurethane Industry Co., Ltd.) | 0.2 part |

The resulting copper powder-containing coating film was treated with superheated steam at 350° C. for 5 min. In the above treatment, a vapor heating apparatus "DHF Super-Hill)" manufactured by Dai-Ichi High Frequency Co., Ltd., was used as an apparatus for generating superheated steam, and the superheated steam generated therein was supplied to a heat treatment furnace at a rate of 10 kg/hr. The evaluation results of the resulting conductive coating film are shown in Table 4.

Examples 2 to 4

The same procedure as in Example 1 was conducted except that AC-2 was used as the insulating substrate, and the conditions for the superheated steam treatment were changed as shown in Table 4, thereby obtaining conductive coating films. The evaluation results of the thus obtained conductive coating films are shown in Table 4.

Examples 5 and 6

The same procedure as in Example 1 was conducted except that the insulating substrate was changed as shown in Table 4, thereby obtaining conductive coating films. The evaluation results of the thus obtained conductive coating films are shown in Table 4.

Examples 7 to 9

The same procedure as in Example 1 was conducted except that the insulating substrate was changed as shown in Table 4, and the copper particles were replaced with copper particles 2, thereby obtaining conductive coating films. The evaluation results of the thus obtained conductive coating films are shown in Table 4.

Examples 10 and 11

The same procedure as in Example 1 was conducted except that the insulating substrate was changed as shown in Table 4, the copper particles were replaced with copper particles 1, and the conditions for the superheated steam treatment were changed as shown in Table 4, thereby obtaining conductive coating films. The evaluation results of the thus obtained conductive coating films are shown in Table 4.

Examples 12 and 13

The same procedure as in Example 1 was conducted except that the insulating substrate was changed as shown in Table 4, the copper particles were replaced with copper particles 2, and the conditions for the superheated steam treatment were changed as shown in Table 4, thereby obtaining conductive coating films. The evaluation results of the thus obtained conductive coating films are shown in Table 4.

Examples 14 and 15

The same procedure as in Example 1 was conducted except that the insulating substrate was changed as shown in Table 4, thereby obtaining conductive coating films. The evaluation results of the thus obtained conductive coating films are shown in Table 4.

In addition, the conductive coating films obtained in Examples 14 and 15 were allowed to stand in a constant-temperature oven at 130° C. for 10 days. The samples withdrawn from the constant-temperature oven was colored blackish blue and suffered from curling. As a result of subjecting these samples to the same tape peel test as used in Example 1 to examine an adhesion property thereof, it was confirmed that the samples obtained in Examples 14 and 15 both were acceptable similarly to initially obtained ones.

TABLE 4

| | Examples | | | | |
|---|---|---|---|---|---|
| | 1 | 2 | 3 | 4 | 5 |
| Polyimide film with resin cured layer | AC-1 | AC-2 | AC-2 | AC-2 | AC-3 |
| Metal powder-containing layer | | | | | |
| Binder | | | | | |
| Copolyester | 1 | 1 | 1 | 1 | 1 |
| Metal particles | | | | | |
| Copper particles-1 | 9 | 9 | 9 | 9 | 9 |
| Copper particles-2 | | | | | |
| Silver particles-1 | | | | | |
| Silver particles-2 | | | | | |
| Curing agent & additives | | | | | |
| Blocked isocyanate | 0.2 | 0.2 | 0.2 | 0.2 | 0.2 |
| Specific resistance before superheated steam treatment (μΩ·cm) | ≥$10^4$ | ≥$10^4$ | ≥$10^4$ | ≥$10^4$ | ≥$10^4$ |
| Superheated steam treatment [temp. (° C.) × time (min)] | 350 × 5 | 280 × 5 | 350 × 10 | 400 × 5 | 350 × 5 |
| Measurement results | | | | | |
| Adhesion property | A | A | A | B | A |
| Specific resistance (μΩ·cm) | 25 | 35 | 7.8 | 8.1 | 7.4 |

| | Examples | | | | |
|---|---|---|---|---|---|
| | 6 | 7 | 8 | 9 | 10 |
| Polyimide film with resin cured layer | AC-4 | AC-5 | AC-6 | AC-7 | AC-8 |

TABLE 4-continued

| | Metal powder-containing layer | | | | |
|---|---|---|---|---|---|
| Binder | | | | | |
| Copolyester | 1 | 1 | 1 | 1 | 1 |
| Metal particles | | | | | |
| Copper particles-1 | 9 | | | | |
| Copper particles-2 | | 9 | 9 | 9 | |
| Silver particles-1 | | | | | 9 |
| Silver particles-2 | | | | | |
| Curing agent & additives | | | | | |
| Blocked isocyanate | 0.2 | 0.2 | 0.2 | 0.2 | 0.2 |
| Specific resistance before superheated steam treatment ($\mu\Omega \cdot cm$) | $\geq 10^4$ | $\geq 10^4$ | $\geq 10^4$ | $\geq 10^4$ | 74 |
| Superheated steam treatment [temp. (° C.) × time (min)] | 350 × 5 | 350 × 5 | 350 × 5 | 350 × 5 | 250 × 30 |
| Measurement results | | | | | |
| Adhesion property | B | A | B | A | A |
| Specific resistance ($\mu\Omega \cdot cm$) | 39 | 12 | 16 | 8.3 | 7.1 |

| | Examples | | | | |
|---|---|---|---|---|---|
| | 11 | 12 | 13 | 14 | 15 |
| Polyimide film with resin cured layer | AC-9 | AC-10 | AC-11 | AC-12 | AC-13 |
| Metal powder-containing layer | | | | | |
| Binder | | | | | |
| Copolyester | 1 | 1 | 1 | 1 | 1 |
| Metal particles | | | | | |
| Copper particles-1 | | | | 9 | 9 |
| Copper particles-2 | | | | | |
| Silver particles-1 | 9 | | | | |
| Silver particles-2 | | 9 | 9 | | |
| Curing agent & additives | | | | | |
| Blocked isocyanate | 0.2 | 0.2 | 0.2 | 0.2 | 0.2 |
| Specific resistance before superheated steam treatment ($\mu\Omega \cdot cm$) | 88 | 79 | 74 | $\geq 10^4$ | $\geq 10^4$ |
| Superheated steam treatment [temp. (° C.) × time (min)] | 250 × 30 | 250 × 30 | 250 × 30 | 350 × 5 | 350 × 5 |
| Measurement results | | | | | |
| Adhesion property | A | A | A | A | A |
| Specific resistance ($\mu\Omega \cdot cm$) | 17 | 12 | 35 | 8.9 | 6.6 |

Example 16

The composition with the following formulation was charged into a sand mill, and dispersed at 800 rpm for 2 hr. As dispersing media, there were used zirconia beads having a radius of 0.2 mm. The obtained copper paste was applied onto the resin cured layer (AC-2) formed on the polyimide film using an applicator such that the thickness of the coating film obtained after dried was 2 μm, and then subjected to hot-air drying at 120° C. for 5 min, thereby obtaining a copper powder-containing coating film.

Composition of Dispersion

| | |
|---|---|
| Copolyester solution (in the form of a 40% by weight solution in toluene/cyclohexanone = 1/1 (weight ratio)) | 2.5 parts |
| Copper particles 1 (average particle diameter: 0.07 μm) | 9 parts |
| γ-Butyrolactone (diluent) | 3.5 parts |
| Methyl ethyl ketone (diluent) | 5 parts |
| Oxetane compound | 0.3 part |
| (in which copolyester: "VYLON 300" produced by Toyo Boseki Kabushiki Kaisha; oxetane compound: "OXT-221" produced by Toagosei Co., Ltd.) | |

The resulting copper powder-containing coating film was treated with superheated steam at 320° C. for 5 min. In the above treatment, a vapor heating apparatus "DHF Super-Hill)" manufactured by Dai-Ichi High Frequency Co., Ltd., was used as an apparatus for generating superheated steam, and the superheated steam generated therein was supplied to a heat treatment furnace at a rate of 10 kg/hr. After completion of the superheated steam treatment, the obtained conductive coating film was immersed in the following copper sulfate plating bath and subjected to copper electroplating at a current density of 2 A/dm² to form a 15 μm-thick copper plating layer on the copper powder-containing coating film. The peel strength of the plating layer after the elapse of one day (as untreated sample) was measured, whereas the peel strength of the plating layer after allowing the copper plating layer-containing conductive coating film to stand at 150° C. for 10 days as a heat resistance test sample was also measured. The results are shown in Table 5.

Copper Sulfate Plating Bath:

| | |
|---|---|
| Copper sulfate pentahydrate | 70 parts |
| Sulfuric acid | 200 parts |
| Sodium chloride | 0.1 part |
| Water | 800 parts |
| Brightener | 5 parts |
| (brightener: "Top Lucina" produced by Okuno Chemical Industries Co., Ltd.) | |

Examples 17 and 18

The same procedure as in Example 16 was conducted except that the compounds added to the copper paste were changed as shown in Table 5, thereby obtaining copper plating layer-containing conductive coating films. The resulting conductive coating films were evaluated by the same method as used in Example 16. The evaluation results are shown in Table 5.

TABLE 5

| | Examples | | |
|---|---|---|---|
| | 16 | 17 | 18 |
| Polyimide film with resin cured layer | AC-3 | AC-3 | AC-3 |
| Metal powder-containing layer | | | |
| Binder | | | |
| Copolyester | 1 | 1 | 1 |
| Metal particles | | | |
| Copper particles-1 | 9 | 9 | 9 |

TABLE 5-continued

| | Examples | | |
|---|---|---|---|
| | 16 | 17 | 18 |
| Curing agent & additives | | | |
| Oxetane | 0.3 | | |
| Epoxy resin-2 | | 0.3 | |
| Epoxy resin-3 | | | 0.3 |
| Acid anhydride | | | 0.2 |
| Specific resistance before superheated steam treatment (μΩ · cm) | ≥$10^4$ | ≥$10^4$ | ≥$10^4$ |
| Superheated steam treatment [temp. (° C.) × time (min)] | 320 × 5 | 320 × 5 | 320 × 5 |
| Measurement results Conductive coating film | | | |
| Adhesion property | A | A | A |
| Specific resistance (μΩ · cm) | 6.1 | 7.1 | 5.8 |
| Thickness of copper plating layer (μm) | 15 | 15 | 15 |
| Plating layer-containing conductive coating film Peel strength (N/cm) | | | |
| Untreated sample | 5.7 | 6.8 | 7.1 |
| After allowed to stand at 150° C. for 10 days | 6.4 | 6.7 | 7.9 |

Note
Oxetane: "OXT-221" produced by Toagosei Co., Ltd.
Epoxy resin-2: Bisphenol A-type liquid epoxy resin "828" produced by Mitsubishi Chemical Corporation.
Epoxy resin-3: Alicyclic epoxy resin "CEL2021P" produced by Daicel Corp.
Acid anhydride: "HM-700G" produced by New Japan Chemical Co., Ltd.

Comparative Example 1

The composition with the following formulation was charged into a sand mill, and dispersed at 800 rpm for 2 hr. As dispersing media, there were used zirconia beads having a radius of 0.2 mm. The obtained copper paste was applied onto a polyimide film "APICAL NPI (thickness: 25 μm)" produced by KANEKA Corp., using an applicator such that the thickness of the coating film obtained after dried was 2 μm, and then subjected to hot-air drying at 120° C. for 5 min, thereby obtaining a copper powder-containing coating film.
Composition of Dispersion

| | |
|---|---|
| Copolyester solution (in the form of a 40% by weight solution in toluene/cyclohexanone = 1/1 (weight ratio)) | 2.5 parts |
| Copper particles 1 (average particle diameter: 0.07 μm) | 9 parts |
| γ-Butyrolactone (diluent) | 3.5 parts |
| Methyl ethyl ketone (diluent) | 5 parts |
| Blocked isocyanate (in which copolyester: "VYLON 300" produced by Toyo Boseki Kabushiki Kaisha; blocked isocyanate: "CORONATE 2546" produced by Nippon Polyurethane Industry Co., Ltd.) | 0.2 part |

The resulting copper powder-containing coating film was treated with superheated steam at 350° C. for 5 min. In the above treatment, a vapor heating apparatus "DHF Super-Hill)" manufactured by Dai-Ichi High Frequency Co., Ltd., was used as an apparatus for generating superheated steam, and the superheated steam generated therein was supplied to a heat treatment furnace at a rate of 10 kg/hr. The evaluation results of the resulting conductive coating film are shown in Table 6.

In addition, the thus obtained conductive coating film was allowed to stand in a constant-temperature oven at 130° C. for 10 days in the same manner as in Examples 14 and 15. The sample withdrawn from the constant-temperature oven was colored blackish blue and suffered from curling. As a result of subjecting the sample to the same tape peel test as used in Example 1 to examine an adhesion property thereof, it was confirmed that the coating film was peeled off over an entire surface thereof.

Comparative Examples 2 to 4

The same procedure as in Comparative Example 1 was conducted except that the conditions for the superheated steam treatment were changed, thereby obtaining conductive coating films. The evaluation results are shown in Table 6.

Comparative Examples 5 to 7

The same procedure as in Comparative Example 1 was conducted except that the copper particles 1 were replaced with the metal particles shown in Table 6, thereby obtaining conductive coating films. The evaluation results are shown in Table 6.

Comparative Examples 8 to 12

The same procedure as in Example 1 was conducted except that the polyimide film with the resin cured layer was changed as shown in Table 6, thereby obtaining conductive coating films. The evaluation results are shown in Table 6.

TABLE 6

| | Comparative Examples | | | |
|---|---|---|---|---|
| | 1 | 2 | 3 | 4 |
| Polyimide film with resin cured layer | — | — | — | — |
| Metal powder-containing layer | | | | |
| Binder | | | | |
| Copolyester | 1 | 1 | 1 | 1 |
| Metal particles | | | | |
| Copper particles-1 | 9 | 9 | 9 | 9 |
| Copper particles-2 | | | | |
| Silver particles-1 | | | | |
| Silver particles-2 | | | | |
| Curing agent | | | | |
| Blocked isocyanate | 0.2 | 0.2 | 0.2 | 0.2 |
| Specific resistance before superheated steam treatment (μΩ · cm) | ≥$10^4$ | ≥$10^4$ | ≥$10^4$ | ≥$10^4$ |
| Superheated steam treatment [temp. (° C.) × time (min)] | 350 × 5 | 280 × 5 | 350 × 10 | 400 × 5 |
| Measurement results | | | | |
| Adhesion property | C | C | C | C |
| Specific resistance (μΩ · cm) | 19 | 33 | 8.1 | 7.9 |

TABLE 6-continued

| | Comparative Examples | | | |
|---|---|---|---|---|
| | 5 | 6 | 7 | 8 |
| Polyimide film with resin cured layer | — | — | — | AC-14 |
| Metal powder-containing layer | | | | |
| Binder | | | | |
| Copolyester | 1 | 1 | 1 | 1 |
| Metal particles | | | | |
| Copper particles-1 | | | | 9 |
| Copper particles-2 | 9 | | | |
| Silver particles-1 | | 9 | | |
| Silver particles-2 | | | 9 | |
| Curing agent | | | | |
| Blocked isocyanate | 0.2 | | | 0.2 |
| Specific resistance before superheated steam treatment (μΩ · cm) | ≥$10^4$ | 62 | 82 | ≥$10^4$ |
| Superheated steam treatment [temp. (° C.) × time (min)] | 350 × 5 | 250 × 5 | 250 × 5 | 350 × 5 |
| Measurement results | | | | |
| Adhesion property | C | C | B | C |
| Specific resistance (μΩ · cm) | 14 | 6.8 | 14 | 65 |

| | Comparative Examples | | | |
|---|---|---|---|---|
| | 9 | 10 | 11 | 12 |
| Polyimide film with resin cured layer | AC-15 | AC-16 | AC-17 | AC-18 |
| Metal powder-containing layer | | | | |
| Binder | | | | |
| Copolyester | 1 | 1 | 1 | 1 |
| Metal particles | | | | |
| Copper particles-1 | 9 | 9 | 9 | 9 |
| Copper particles-2 | | | | |
| Silver particles-1 | | | | |
| Silver particles-2 | | | | |
| Curing agent | | | | |
| Blocked isocyanate | 0.2 | 0.2 | 0.2 | 0.2 |
| Specific resistance before superheated steam treatment (μΩ · cm) | ≥$10^4$ | ≥$10^4$ | ≥$10^4$ | ≥$10^4$ |
| Superheated steam treatment [temp. (° C.) × time (min)] | 350 × 5 | 350 × 5 | 350 × 5 | 350 × 5 |
| Measurement results | | | | |
| Adhesion property | B | C | C | C |
| Specific resistance (μΩ · cm) | 51 | 48 | 86 | 8.3 |

Comparative Example 13

The composition with the following formulation was charged into a sand mill, and dispersed at 800 rpm for 2 hr. As dispersing media, there were used zirconia beads having a radius of 0.2 mm. The obtained copper paste was applied onto a polyimide film "APICAL NPI (thickness: 25 μm)" produced by KANEKA Corp., using an applicator such that the thickness of the coating film obtained after dried was 2 μm, and then subjected to hot-air drying at 120° C. for 5 min, thereby obtaining a copper powder-containing coating film.

Composition of Dispersion

| | |
|---|---|
| Copolyester solution (in the form of a 40% by weight solution in toluene/cyclohexanone = 1/1 (weight ratio)) | 2.5 parts |
| Copper particles 1 (average particle diameter: 0.07 μm) | 9 parts |
| γ-Butyrolactone (diluent) | 3.5 parts |
| Methyl ethyl ketone (diluent) | 5 parts |
| Oxetane compound | 0.3 part |

(in which copolyester: "VYLON 300" produced by Toyo Boseki Kabushiki Kaisha; oxetane compound: "OXT-221" produced by Toagosei Co., Ltd.)

The resulting copper powder-containing coating film was treated with superheated steam at 320° C. for 5 min. In the above treatment, a vapor heating apparatus "DHF Super-Hill)" manufactured by Dai-Ichi High Frequency Co., Ltd., was used as an apparatus for generating superheated steam, and the superheated steam generated therein was supplied to a heat treatment furnace at a rate of 10 kg/hr. The obtained conductive coating film was immersed in the following copper sulfate plating bath and subjected to copper electroplating at a current density of 2 A/dm² to form a 15 μm-thick copper plating layer on the conductive coating film. The peel strength of the plating layer after the elapse of one day (as untreated sample) was measured, whereas the peel strength of the plating layer after allowing the copper plating layer-containing conductive coating film to stand at 150° C. for 10 days as a heat resistance test sample was also measured. The evaluation results of the thus obtained conductive coating film and copper plating layer-containing conductive coating film are shown in Table 7.

Copper Sulfate Plating Bath:

| | |
|---|---|
| Copper sulfate pentahydrate | 70 parts |
| Sulfuric acid | 200 parts |
| Sodium chloride | 0.1 part |
| Water | 800 parts |
| Brightener | 5 parts |

(brightener: "Top Lucina M" produced by Okuno Chemical Industries Co., Ltd.)

Comparative Examples 14 and 15

The same procedure as in Example 16 was conducted except that the polyimide film with the resin cured layer and the materials added were changed as shown in Table 7, thereby obtaining conductive coating films and plating layer-containing conductive coating films. The evaluation results of the thus obtained conductive coating films and plating layer-containing conductive coating films are shown in Table 7.

TABLE 7

| | Comparative Examples | | |
|---|---|---|---|
| | 13 | 14 | 15 |
| Polyimide film with resin cured layer | — | AC-17 | AC-17 |
| Metal powder-containing layer | | | |
| Binder | | | |
| Copolyester | 1 | 1 | 1 |
| Metal particles | | | |
| Copper particles-1 | 9 | 9 | 9 |

TABLE 7-continued

| | Comparative Examples | | |
|---|---|---|---|
| | 13 | 14 | 15 |
| Curing agent & additives | | | |
| Oxetane | 0.3 | 0.3 | |
| Epoxy resin-3 | | | 0.3 |
| Acid anhydride | | | 0.2 |
| Specific resistance before superheated steam treatment ($\mu\Omega \cdot$ cm) | $\geq 10^4$ | $\geq 10^4$ | $\geq 10^4$ |
| Superheated steam treatment [temp. (° C.) × time (min)] | 320 × 5 | 320 × 5 | 320 × 5 |
| Measurement results Conductive coating film | | | |
| Adhesion property | C | C | C |
| Specific resistance ($\mu\Omega \cdot$ cm) | 6.3 | 75 | 53 |
| Thickness of copper plating layer ($\mu$m) | 15 | 15 | 15 |
| Plating layer-containing conductive coating film Peel strength (N/cm) | | | |
| Untreated sample | 0.5 | 1.5 | 1.2 |
| After allowed to stand at 150° C. for 10 days | 0 | 0.5 | 0.4 |

Note
Oxetane: "OXT-221" produced by Toagosei Co., Ltd.
Epoxy resin-3: Alicyclic epoxy resin "CEL2021P" produced by Daicel Corp.
Acid anhydride: "HM-700G" produced by New Japan Chemical Co., Ltd.

INDUSTRIAL APPLICABILITY

The conductive coating film and plating layer-containing conductive coating film obtained according to the present invention have such a structure that the conductive coating film is laminated on a polyimide-based insulating substrate through a resin cured layer. When subjected to the superheated steam treatment, the obtained conductive coating film not only can exhibit an excellent conductivity, but also can be improved in adhesion property to the insulating substrate. These conductive coating films can be used in a metal/resin laminate, a metal thin film forming material for electromagnetic shielding metal thin films, a metal wiring material, a conductive material, or the like.

The invention claimed is:

1. A process for producing a conductive coating film, comprising the steps of:
    forming a resin cured layer having a solvent-soluble content of not more than 20% by weight and a thickness of 0.5 to 5 μm on a polyimide-based insulating substrate,
    the step of forming the resin cured layer comprising
        applying an organic solvent solution of resin onto the polyimide-based insulating substrate and
        drying the organic solvent solution of resin to form the resin cured layer,
    wherein the resin cured layer comprises a reaction product of a resin and a curing agent, an amount of the curing agent being 10 to 30 parts by weight based on 100 parts by weight of the resin,
    wherein the resin of the resin cured layer consists of one or more resins selected from the group consisting of polyesters, polyurethanes, polycarbonates, polyethers, polyamides, polyamide imides, polyimides, and mixtures thereof, and
    wherein the curing agent of the resin cured layer consists of one or more curing agents selected from the group consisting of epoxies, isocyanates, phenol resins, tetracarboxylic dianhydride, and mixtures thereof;
    forming a metal powder-containing coating film on the resin cured layer by using a metal powder paste, the metal powder paste comprising metal particles including metal comprising copper, silver, or copper-silver alloy, wherein the metal particles have an average particle diameter of 0.01 to 20 μm; and
    then subjecting the resulting coating film to heat treatment with superheated steam having a temperature of 150 to 450° C.

2. The process for producing a conductive coating film according to claim 1, wherein the metal powder paste comprises metal particles, an organic binder, and a solvent in which the metal particles and the organic binder are dispersed.

3. The process for producing a conductive coating film according to claim 1, wherein the metal powder paste comprises at least one compound selected from the group consisting of a phenol resin, an amino resin, an isocyanate compound, an epoxy compound, an oxetane compound and an acid anhydride.

4. The process for producing a conductive coating film according to claim 1, wherein the metal powder paste comprises at least one compound selected from the group consisting of an epoxy compound, an oxetane compound and an acid anhydride, wherein the at least one compound has a molecular weight of less than 500.

5. The process for producing a conductive coating film according to claim 2, wherein the metal powder paste further comprises metal particles comprising at least one metal selected from the group consisting of copper, nickel, cobalt, silver, platinum, gold, molybdenum and titanium.

6. A process for producing a plating layer-containing conductive coating film, comprising the step of forming a plating layer on the conductive coating film produced by the process as claimed in claim 1.

7. The process for producing a conductive coating film according to claim 1, wherein the insulating substrate and the conductive coating film are configured such that when a cellophane tape is laminated onto the metal powder-containing coating film and peeled off therefrom (i) no peeling occurs between the insulating substrate and the conductive coating film or (ii) peeling occurs between the insulating substrate and the conductive coating film with respect to less than 10% of a laminated area of the cellophane tape.

8. The process for producing a conductive coating film according to claim 1, wherein the organic solvent solution does not include a water dispersion of the resin.

* * * * *